United States Patent
Wu

(10) Patent No.: US 11,177,405 B2
(45) Date of Patent: Nov. 16, 2021

(54) THIN FILM SOLAR CELL

(71) Applicant: GIANTPLUS TECHNOLOGY CO., LTD, Miaoli County (TW)

(72) Inventor: Che-Yao Wu, Taoyuan (TW)

(73) Assignee: GIANTPLUS TECHNOLOGY CO., LTD, Miaoli County (TW)

( * ) Notice: Subject to any disclaimer, the term of this patent is extended or adjusted under 35 U.S.C. 154(b) by 0 days.

(21) Appl. No.: 16/703,865

(22) Filed: Dec. 5, 2019

(65) Prior Publication Data
US 2021/0050463 A1 Feb. 18, 2021

(30) Foreign Application Priority Data

Aug. 15, 2019 (TW) .................................. 108210830

(51) Int. Cl.
| | |
|---|---|
| *H01L 31/0392* | (2006.01) |
| *H01L 31/0224* | (2006.01) |
| *H01L 31/068* | (2012.01) |

(52) U.S. Cl.
CPC .. *H01L 31/0392* (2013.01); *H01L 31/022425* (2013.01); *H01L 31/068* (2013.01)

(58) Field of Classification Search
CPC ........... H01L 31/02327; H01L 31/0236; H01L 31/02363; H01L 31/02366
See application file for complete search history.

(56) References Cited

U.S. PATENT DOCUMENTS

| | | | | |
|---|---|---|---|---|
| 9,831,362 | B2* | 11/2017 | Fan | .................. H01L 31/02366 |
| 2010/0282314 | A1* | 11/2010 | Coakley | ................ H01L 31/076 136/258 |
| 2011/0180133 | A1 | 7/2011 | Verhaverbeke et al. | |
| 2011/0277827 | A1* | 11/2011 | Yang | ....................... C23C 14/34 136/255 |
| 2012/0048367 | A1* | 3/2012 | Kobyakov | ........ H01L 31/03921 136/256 |
| 2013/0193450 | A1* | 8/2013 | Bergbauer | .............. H01L 33/02 257/79 |
| 2016/0211397 | A1* | 7/2016 | Kerzabi | ................. H01L 31/042 |
| 2017/0148930 | A1* | 5/2017 | Zhu | ........................ H01L 31/056 |
| 2017/0149019 | A1* | 5/2017 | Smith | ................. H01L 51/5221 |

FOREIGN PATENT DOCUMENTS

| | | |
|---|---|---|
| CN | 102804390 | 11/2012 |
| TW | I405348 | 8/2013 |

* cited by examiner

*Primary Examiner* — Daniel P Malley, Jr.
(74) *Attorney, Agent, or Firm* — JCIPRNET

(57) ABSTRACT

A thin film solar cell including a substrate, an insulating layer, a first electrode layer, a photovoltaic conversion layer and a second electrode layer is provided. The insulating layer is disposed on the substrate and includes a plurality of microstructures. An orthographic projection of the plurality of microstructures is a regular geometric shape or an irregular geometric shape regarding to a normal direction of the substrate. The first electrode layer is disposed on the insulating layer. A thickness of the first electrode layer is less than 1 μm or is equal to 1 μm. The photovoltaic conversion layer is disposed on the first electrode layer. The second electrode layer is disposed on the photovoltaic conversion layer.

8 Claims, 2 Drawing Sheets

THIN FILM SOLAR CELL

CROSS-REFERENCE TO RELATED APPLICATION

This application claims the priority benefit of Taiwan application serial no. 108210830, filed on Aug. 15, 2019. The entirety of the above-mentioned patent application is hereby incorporated by reference herein and made a part of this specification.

BACKGROUND

Technical Field

The disclosure is related to a thin film solar cell, and particularly to a thin film solar cell with a superstrate configuration.

Description of Related Art

The thin film solar cell could be classified into a thin film solar cell with a superstrate configuration and a thin film solar cell with a substrate configuration according to an incidence direction of an ambient light. With regard to the thin film solar cell with the superstrate configuration, a portion of the ambient light would penetrate a transparent substrate and then being absorbed by a photovoltaic conversion layer, while the remained portion of the ambient light passed through the photovoltaic conversion layer would be reflected by a back electrode layer and then being absorbed by the photovoltaic conversion layer. The amount of the ambient light reflected by the back electrode layer would influence the energy conversion efficiency of the thin film solar cell. In general, a front electrode layer would be formed to have a plurality of microstructures to improve the amount of the reflected ambient light. The ambient light reaching the front electrode layer would be scattered due to the plurality of microstructures, thus, the traveling distance of the scattered light to the back electrode layer would be increased to achieve the condition of total internal reflection, thereby improving the amount of the reflected ambient light.

However, in order to form the plurality of microstructures in the front electrode layer, it is necessary for the front electrode layer to have a larger thickness. A thickness of the conventional front electrode layer is, for example, about 1.5 µm, so that it is conducive to a process of etching, while the cost and the difficulty in the manufacturing process would be increased. Moreover, in light of the ease of the etching characteristic, the front electrode layer is generally selected from aluminum doped zinc oxide (AZO) instead of indium tin oxide (ITO). However, the carrier concentration of AZO would be decreased since aluminum with high activity easily reacts with oxygen, so that the impedance of the thin film solar cell would be increased and then the energy conversion efficiency of the thin film solar cell would be decreased.

SUMMARY

An embodiment of the disclosure provides a thin film solar cell with low impedance, low cost and high energy conversion efficiency.

A thin film solar cell according to an embodiment of the disclosure includes a substrate, an insulating layer, a first electrode layer, a photovoltaic conversion layer and a second electrode layer. The insulating layer is disposed on the substrate and includes a plurality of microstructures. An orthographic projection of the plurality of microstructures is a regular geometric shape or an irregular geometric shape regarding to a normal direction of the substrate. The first electrode layer is disposed on the insulating layer. A thickness of the first electrode layer is less than 1 µm or is equal to 1 µm. The photovoltaic conversion layer is disposed on the first electrode layer. The second electrode layer is disposed on the photovoltaic conversion layer.

In one embodiment of the disclosure, a distance between the neighbor microstructures is from 2 µm to 5 µm.

In one embodiment of the disclosure, a difference among a maximum width of the orthographic projection of the plurality of microstructures regarding to the normal direction of the substrate is less than 2 µm.

In one embodiment of the disclosure, the orthographic projection of the plurality of microstructures regarding to the normal direction of the substrate is a polygon.

In one embodiment of the disclosure, the orthographic projection of the plurality of microstructures regarding to the normal direction of the substrate is a hexagon, an octagon, or a combination thereof.

In one embodiment of the disclosure, a maximum thickness of the insulating layer is from 1 µm to 5 µm.

In one embodiment of the disclosure, the thickness of the first electrode layer is from 0.5 µm to 1 µm.

In one embodiment of the disclosure, a material of the first electrode layer includes indium tin oxide (ITO), aluminum doped zinc oxide (AZO), stannic oxide ($SnO_2$), or indium oxide ($In_2O_3$).

In one embodiment of the disclosure, a material of the photovoltaic conversion layer includes single crystalline silicon, polycrystalline silicon, amorphous silicon, or a combination thereof.

In one embodiment of the disclosure, a top surface of the plurality of microstructures is a smooth surface or a rough surface.

Based on the above, since the insulating layer with the plurality of microstructures according to an embodiment of the disclosure are formed between the first electrode layer and the substrate, the first electrode layer could be easily formed without undergoing a photolithography and etching process and the thickness of the formed first electrode layer is less than 1 µm, so that the thin film solar cell according to an embodiment of the disclosure could achieve the effect of decreasing impedance, decreasing cost and maintaining electrical property.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
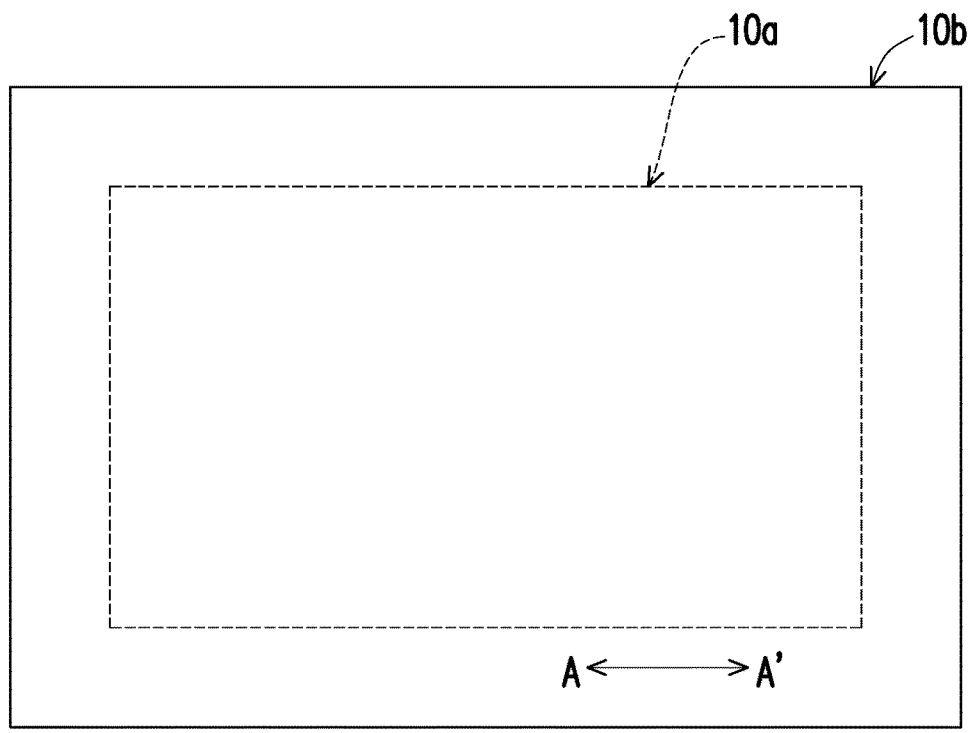
FIG. 1 is a top schematic view of the thin film solar cell according to one embodiment of the disclosure.

The disclosure is more comprehensively described with reference to the figures of the present embodiments. However, the disclosure may also be implemented in various different forms, and is not limited to the embodiments in the present specification. The thicknesses of the layers and regions in the figures are enlarged for clarity. The same or similar reference numerals represent the same or similar devices and are not repeated in the following paragraphs. Additionally, directional terminology, such as "top," "bottom," "left," "right," "front," or "back," etc., is used with reference to the orientation of the Figure(s) being described. As such, the directional terminology is used for purposes of illustration and is in no way limiting.

FIG. 1 is a top schematic view of the thin film solar cell according to one embodiment of the disclosure.

Referring to FIG. 1, a thin film solar cell 10 according to the present disclosure includes a substrate 100 and a solar cell unit 200. The solar cell unit 200 is disposed on a partial region of one side of the substrate 100. The thin film solar cell 10 according to the present embodiment is a thin film solar cell with a superstrate configuration. The above thin film solar cell with the superstrate configuration is known that an ambient light penetrates the substrate 100 and gets inside the solar cell unit 200 after the ambient light is irradiated to the other side of the substrate 100 without the disposition of the solar cell unit 200. Based on the above, it is necessary for the substrate 100 to be formed with a transparent material. In one embodiment, a material of the substrate 100 may be glass, transparent resin or other suitable transparent material. The above transparent resin may be polyethylene terephthalate, polyethylene naphthalate, polycarbonate, polyether or polyimide. In the present embodiment, the material of the substrate 100 is glass.

In a different light, the thin film solar cell 10 has a central region 10a and a peripheral region 10b. The substrate 100 is, for example, disposed in the overall central region 10a and peripheral region 10b, and the solar cell unit 200 is disposed in the overall peripheral region 10b. The solar cell unit 200 is, for example, disposed in the form of multiple lines in the central region 10a, and is occupied 3% to 50% of the central region 10a. It is worth mentioning that although the thin film solar cell 10 appears in the form of rectangle, the disclosure is not limited thereto. For example, the thin film solar cell 10 could appear in the form of circle or other geometric shape.

The thin film solar cell 10 according to the present disclosure could be used in a display (not shown). For example, the thin film solar cell 10 according to the present disclosure could be disposed on a display side of a display panel (not shown), wherein the central region 10a of the thin film solar cell 10 corresponds to a display region of the display panel, and the peripheral region 10b of the thin film solar cell 10 corresponds to a non-display region of the display panel. The central region 10a of the thin film solar cell 10 could not hinder a picture displayed by the display panel since a major portion of the central region 10a of the thin film solar cell 10 is only the substrate 100 including transparent material.

Figure 2A:
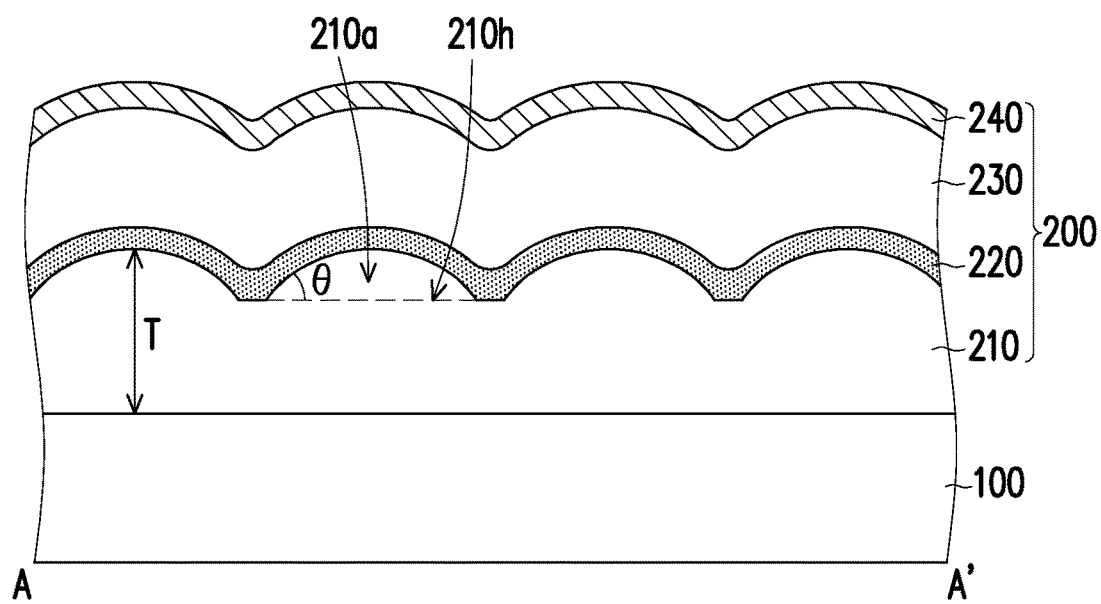
FIG. 2A and FIG. 2B are a schematic cross-sectional view of the thin film solar cell taken along a sectional line A-A' depicted in FIG. 1.
Figure 2B:
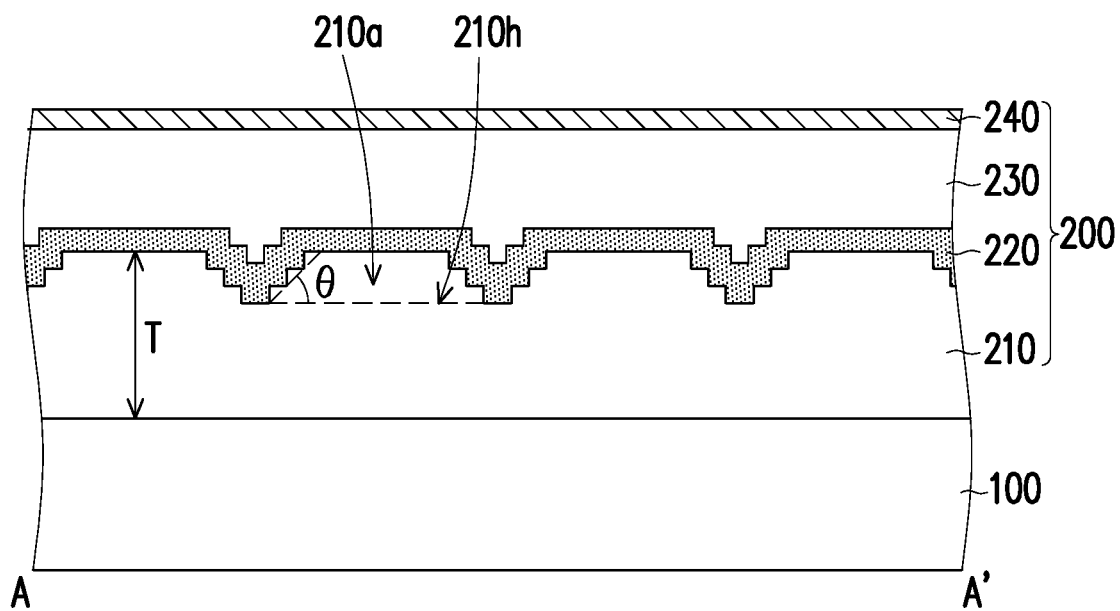
Figure 3:
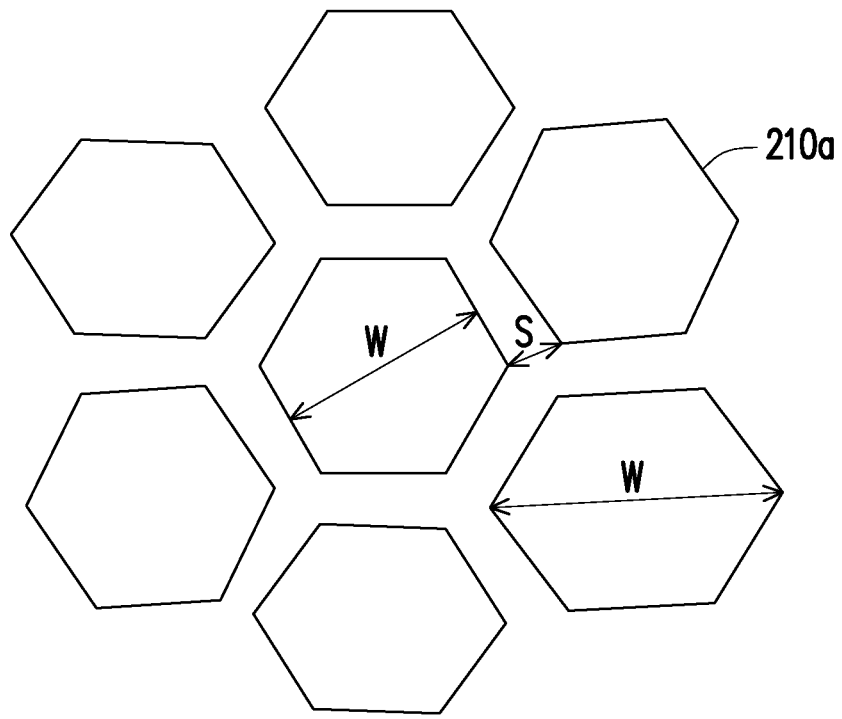
FIG. 3 is a top schematic view of the insulating layer according to one embodiment of the disclosure.

FIG. 2A and FIG. 2B are a schematic cross-sectional view of the thin film solar cell taken along a sectional line A-A' depicted in FIG. 1, and FIG. 3 is a top schematic view of the insulating layer according to one embodiment of the disclosure.

Simultaneously referring to FIG. 2A and FIG. 2B, the solar cell unit 200, for example, includes an insulating layer 210, a first electrode layer 220, a photovoltaic conversion layer 230 and a second electrode layer 240 laminated on the substrate 100 in this order.

The insulating layer 210 is disposed on the substrate 100 and includes a plurality of microstructures 210a. The forming method of the insulating layer 210 are performed, for example, by using a physical vapor deposition (PVD) method or a chemical vapor deposition (CVD) method followed by a photolithography and etching process. As an exemplified example of the formation of the insulating layer 210, the PVD method or the CVD method may be used first to form an insulating material layer (not shown) on the substrate 100. Next, a patterned photoresist layer (not shown) is formed on the insulating material layer. Thereafter, the patterned photoresist layer is used as a mask to perform an etching process to the insulating material layer, thereby forming the insulating layer 210 including the plurality of microstructures 210a. In one embodiment, a material of the insulating layer 210 may be, for example, an inorganic material, an organic material or a combination thereof, providing that the material of the insulating layer 210 is a transparent material. A thickness of the insulating material layer is, for example, from 1 μm to 5 μm, so that it is conducive to the formation of the plurality of microstructures 210a. The formed insulating layer 210 has a top surface with bumps due to the plurality of microstructures 210a, that is, multiple places on the top surface of the insulating layer 210 have a different thickness, so that the insulating layer 210 has a maximum thickness T. In the present embodiment, the maximum thickness T of the insulating layer 210 is from 1 μm to 5 μm.

The plurality of microstructures 210a of the insulating layer 210 appear, for example, the form of a regular shape or an irregular shape while being observed in a normal direction of the substrate 100, that is, an orthographic projection of the plurality of microstructures 210a is a regular geometric shape or an irregular geometric shape regarding to the normal direction of the substrate 100. In one embodiment, the plurality of microstructures 210a of the insulating layer 210 appear the form of a hexagon, an octagon, or a combination thereof while being observed in the normal direction of the insulating layer 210. In the present embodiment shown in FIG. 3, the plurality of microstructures 210a of the insulating layer 210 appear the form of a hexagon while being observed in the normal direction of the insulating layer 210, but the disclosure is not limited thereto.

Referring to FIG. 3, the plurality of microstructures 210a and the gaps among them are shown. A distance S between the neighbor microstructures 210a could be equal or different (namely, there is a maximum distance). In one embodiment, the distance S between the neighbor microstructures 210a is from 2 μm to 5 μm. In addition, the orthographic projection of the plurality of microstructures 210a is a regular geometric shape or an irregular geometric shape regarding to the normal direction of the substrate 100 as stated in above embodiment. For example, the orthographic projection of the plurality of microstructures 210a may be a regular hexagon or an irregular hexagon regarding to the normal direction of the substrate 100. Based on the above, a maximum width W of the orthographic projection of the plurality of microstructures 210a are different from each other regarding to the normal direction of the substrate 100. It is worth mentioning that the maximum width W is known that a line connected by any two points passes through a center of gravity of the regular geometric shape or the irregular geometric shape. In one embodiment, the maximum width W of the orthographic projection of each microstructures 210a regarding to the normal direction of the substrate 100 is from 3 μm to 100 μm. Moreover, a difference among the maximum width W of the orthographic projection of the plurality of microstructures 210a regarding to the normal direction of the substrate 100 is, for example, less than 2 μm. When the distance S between the neighbor microstructures 210a or the difference among the maximum width W of the orthographic projection of the plurality of microstructures 210a regarding to the normal direction of the substrate 100 is within above range, the plurality of microstructures 210a could make a large amount of the ambient light scatter to increase the traveling distance to the back electrode, so that the condition of total internal reflection could be achieved and the ambient light could be reflected from the back electrode to the photovoltaic conversion layer.

In addition, as shown in FIG. 2a and FIG. 2B, an included angle ⊖ is between a plane 210h (wherein the plane 210h is parallel to a surface of the substrate) and the plurality of microstructures 210a thereon, and a value of the included angle ⊖ could be adjusted, which depends on circumstances. For example, the value of the included angle ⊖ could be adjusted to have a smaller value while the major amount of the ambient light is expected to travel in straight lines, that is, the surface of the insulating layer 210 is smoother to reduce the amount of the scattered ambient light. In addition, the value of the included angle ⊖ could be adjusted to have a larger value while the major amount of the ambient light is expected to scatter and to travel in oblique lines (namely, the scattered ambient light), that is, the surface of the insulating layer 210 is rougher, thereby increasing the amount of the scattered ambient light and the ambient light traveling in oblique lines. In the present embodiment, the value of the included angle ⊖ is from 5 degrees to 50 degrees. As the exemplified examples respectively shown in FIG. 2a and FIG. 2B, a top surface of the plurality of microstructures 210a (namely, a top surface far from the substrate 100) is a smooth surface or a rough surface, wherein the rough surface is a stepped surface.

The plurality of microstructures 210a of the insulating layer 210 could make the ambient light scatter to increase the traveling distance to the second electrode layer 240, so that the large amount of the ambient light could be reflected by the second electrode layer 240 and then reaches the photovoltaic conversion layer 230. Based on the above, the quantity of electricity converted from the photovoltaic conversion layer 230 could be improved.

The first electrode layer 220 is, for example, disposed on the insulating layer 210 to be used as the front electrode of the thin film solar cell 10. The forming method of the first electrode layer 220 are performed, for example, by using a PVD method or a metal chemical vapor deposition (MCVD) method to form the first electrode layer 220 on the overall insulating layer 210. Namely, it is not necessary for the first electrode layer 220 to have a plurality of microstructures by performing a photolithography and etching process. A material of the first electrode layer 220 is, for example, a transparent conductive oxide (TCO). For example, the material of the first electrode layer 220 includes indium tin oxide (ITO), aluminum doped zinc oxide (AZO), stannic oxide ($SnO_2$), or indium oxide ($In_2O_3$). In the present embodiment, the material of the first electrode layer 220 is selected from indium tin oxide with lower impedance. Since it is not necessary for the first electrode layer 220 to have the plurality of microstructures, a thickness of the first electrode layer may be less than 1 μm or is equal to 1 μm, which makes the selection of the material of the first electrode layer 220 have more flexibility. In one embodiment, the thickness of the first electrode layer 220 is from 0.5 μm to 1 μm.

Compared to the conventional technology, it is not necessary for the first electrode layer 220 to further undergo the process of forming the plurality of microstructures. Therefore, the thickness of the formed first electrode layer 220 may be smaller, and the effect of decreasing impedance, decreasing cost and maintaining electrical property could be achieved.

The photovoltaic conversion layer 230 is, for example, disposed on the first electrode layer 220. In one embodiment, a material of the photovoltaic conversion layer 230 includes single crystalline silicon, polycrystalline silicon, amorphous silicon, or a combination thereof. Namely, the thin film solar cell 10 according to the present disclosure is a kind of a thin film silicon solar cell. In the present embodiment, the material of the photovoltaic conversion layer 230 is amorphous silicon. For example, the photovoltaic conversion layer 230 may include a first extrinsic semiconductor layer (not shown), an intrinsic semiconductor layer (not shown) and a second extrinsic semiconductor layer (not shown) laminated thereon in this order, wherein the first extrinsic semiconductor layer includes a first doping type, and the second extrinsic semiconductor layer includes a second doping type. The above first doping type and second doping type respectively are one of P-type and N-type. In one embodiment, the first doping type is P-type, and the second doping type is N-type, but the disclosure is not limited thereto.

The second electrode layer 240 is, for example, disposed on the photovoltaic conversion layer 230 to be used as the back electrode of the thin film solar cell 10. A material of the second electrode layer 240 is preferably selected from a metal material with low impedance and high reflectivity. In one embodiment, the material of the second electrode layer 240 may be silver (Ag), aluminum (Al) or a combination of other metals with high reflectivity.

In summary, since the insulating layer with the plurality of microstructures according to the disclosure is formed between the first electrode layer and the substrate, the ambient light is scattered enough, so that a major portion of the scattered ambient light is reflected by the second electrode layer and then absorbed by the photovoltaic conversion layer, thereby improving the energy conversion efficiency of the thin film solar cell. In addition, the first electrode layer according to the disclosure could be easily formed without undergoing a photolithography and etching process and the thickness of the formed first electrode layer may be less than 1 μm, so that the thin film solar cell according to the disclosure could achieve the effect of decreasing impedance, decreasing cost and maintaining electrical property.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A thin film solar cell, comprising:
  a substrate;
  an insulating layer, disposed on the substrate and includes a plurality of microstructures, wherein an orthographic projection of the plurality of microstructures is a regular geometric shape or an irregular geometric shape regarding to a normal direction of the substrate, a maximum width of the orthographic projection of the plurality of microstructures regarding to the normal direction of the substrate is from 3 μm to 100 μm, a difference among the maximum width of the ortho- graphic projection of the plurality of microstructures regarding to the normal direction of the substrate is less than 2 μm, and a distance between two adjacent microstructures of the plurality of microstructures is from 2 μm to 5 μm;

a first electrode layer, disposed on the insulating layer, wherein a thickness of the first electrode layer is less than 1 μm or is equal to 1 μm;

a photovoltaic conversion layer, disposed on the first electrode layer; and a second electrode layer, disposed on the photovoltaic conversion layer, wherein the thin film solar cell has a superstrate configuration, wherein the thin film solar cell comprises a central region and a peripheral region, and a thin film solar cell unit of the thin film solar cell comprises the insulating layer, the first electrode layer, the photovoltaic conversion layer, and the second electrode and is disposed in a form of multiple lines that occupies 3% to 50% of the central region.

2. The thin film solar cell according to claim 1, wherein the orthographic projection of the plurality of microstructures regarding to the normal direction of the substrate is a polygon.

3. The thin film solar cell according to claim 2, wherein the orthographic projection of the plurality of microstructures regarding to the normal direction of the substrate is a hexagon, an octagon, or a combination thereof.

4. The thin film solar cell according to claim 1, wherein a maximum thickness of the insulating layer is from 1 μm to 5 μm.

5. The thin film solar cell according to claim 1, wherein the thickness of the first electrode layer is from 0.5 μm to 1 μm.

6. The thin film solar cell according to claim 1, wherein a material of the first electrode layer includes indium tin oxide (ITO), aluminum doped zinc oxide (AZO), stannic oxide ($SnO_2$), or indium oxide ($In_2O_3$).

7. The thin film solar cell according to claim 1, wherein a material of the photovoltaic conversion layer includes single crystalline silicon, polycrystalline silicon, amorphous silicon, or a combination thereof.

8. The thin film solar cell according to claim 1, wherein a top surface of the plurality of microstructures is a smooth surface or a rough surface.

* * * * *